(12) United States Patent
Chen et al.

(10) Patent No.: US 8,743,641 B2
(45) Date of Patent: Jun. 3, 2014

(54) MEMORY WITH TEMPERATURE COMPENSATION

(75) Inventors: Chung-Kuang Chen, Pan Chiao (TW);
Han-Sung Chen, Hsinchu (TW);
Chun-Hsiung Hung, Hsinchu (TW)

(73) Assignee: Macronix International Co., Ltd. (TW)

( * ) Notice: Subject to any disclaimer, the term of this patent is extended or adjusted under 35 U.S.C. 154(b) by 280 days.

(21) Appl. No.: 13/227,249

(22) Filed: Sep. 7, 2011

(65) Prior Publication Data

US 2013/0058181 A1    Mar. 7, 2013

(51) Int. Cl.
*G11C 7/04* (2006.01)

(52) U.S. Cl.
USPC .................... 365/211; 365/189.09; 365/210.1

(58) Field of Classification Search
USPC .................................. 365/211, 189.09, 210.1
See application file for complete search history.

(56) References Cited

U.S. PATENT DOCUMENTS

| | | | |
|---|---|---|---|
| 7,315,482 B2 * | 1/2008 | Lin et al. ................... | 365/210.1 |
| 7,471,582 B2 * | 12/2008 | Choy et al. ................ | 365/211 |
| 7,808,842 B1 * | 10/2010 | Raghavan et al. ....... | 365/189.07 |
| 2008/0025121 A1 * | 1/2008 | Tanzawa ..................... | 365/212 |

* cited by examiner

*Primary Examiner* — Toan Le
(74) *Attorney, Agent, or Firm* — Baker & McKenzie LLP

(57) ABSTRACT

A memory element in which the temperature coefficient of a memory cell substantially matches the temperature coefficient of a reference cell and tuning either the temperature coefficient of a memory cell to substantially match the temperature coefficient of the reference cell provides for improved precision of sensing or reading memory element states, particularly so as to minimize the affect of temperature variations on reading and sensing states.

27 Claims, 21 Drawing Sheets

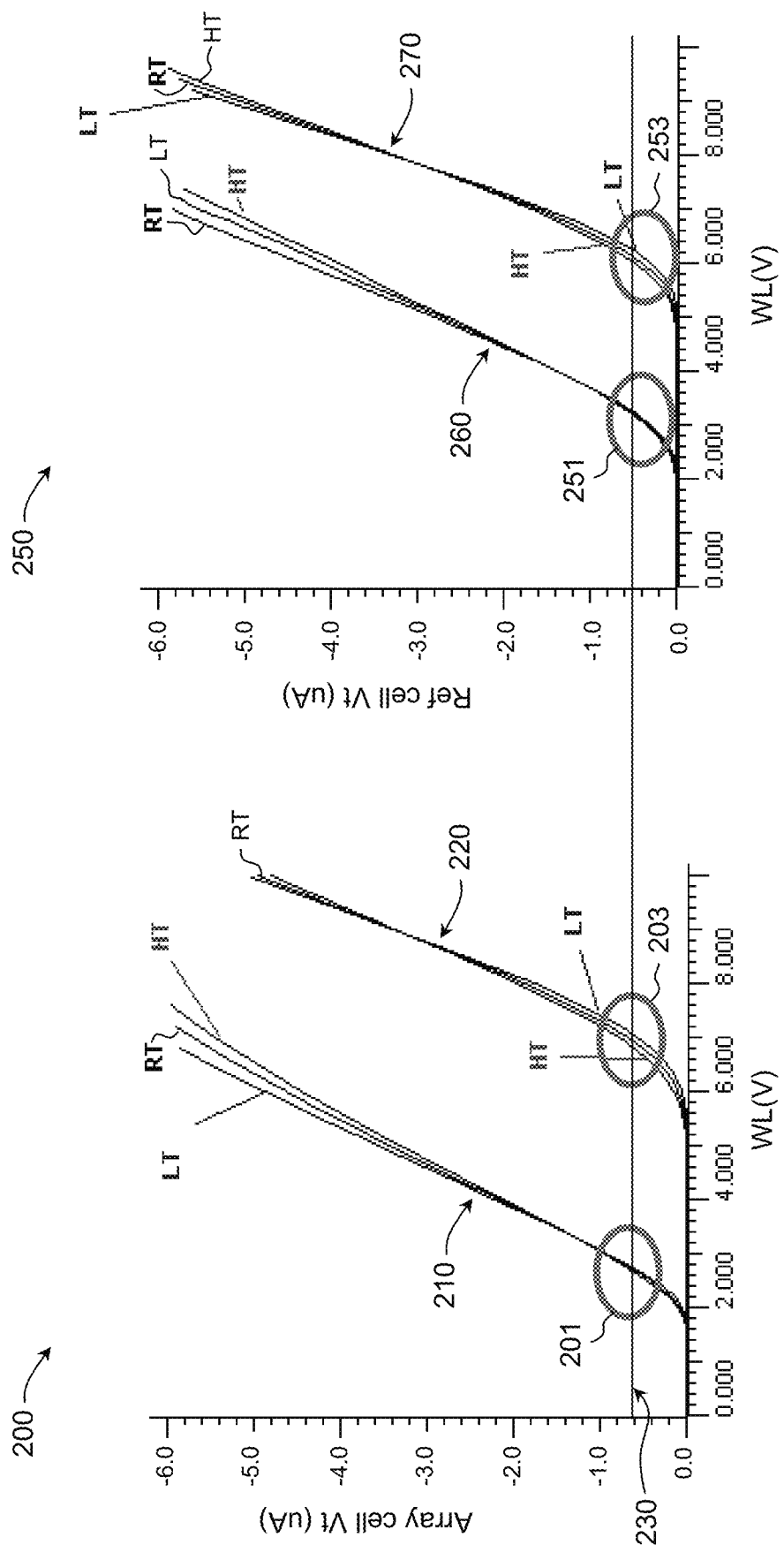

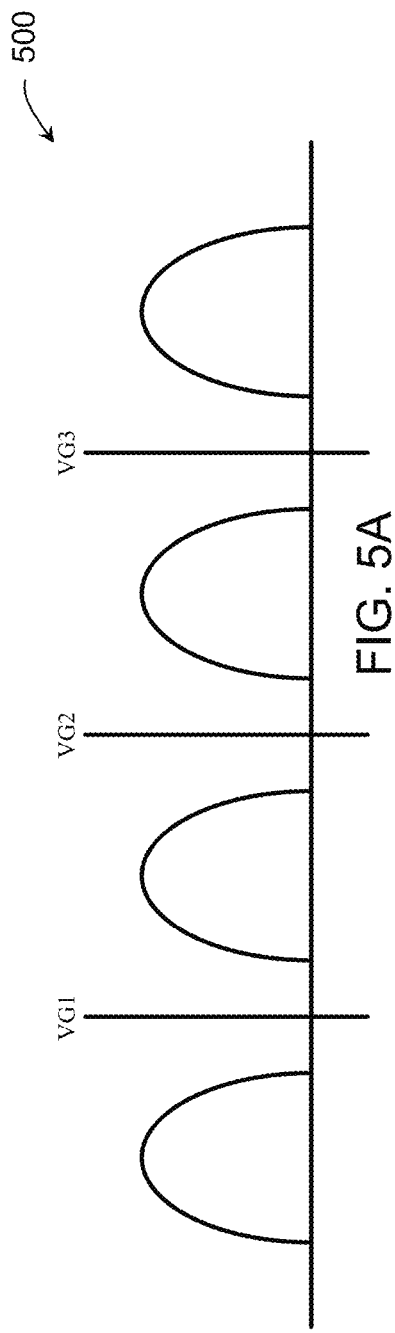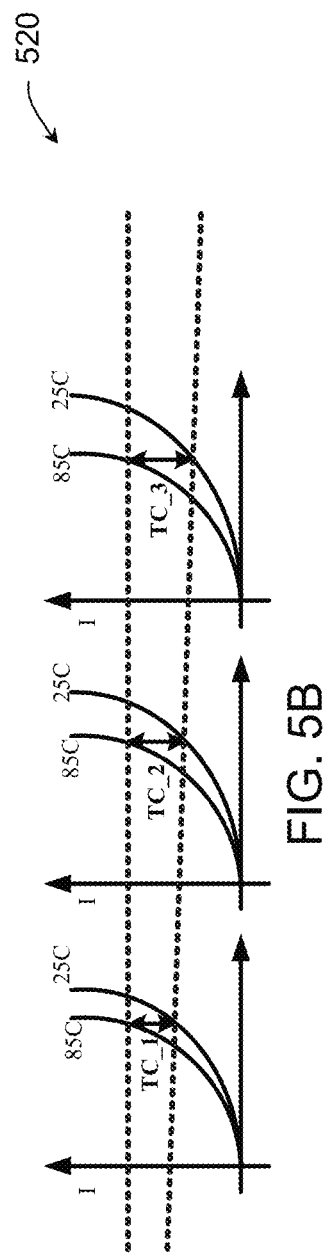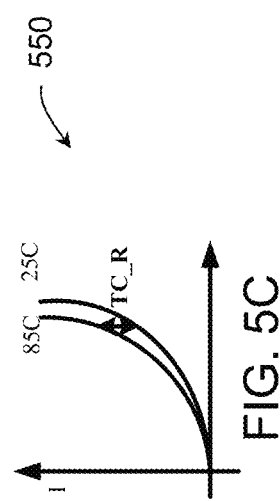

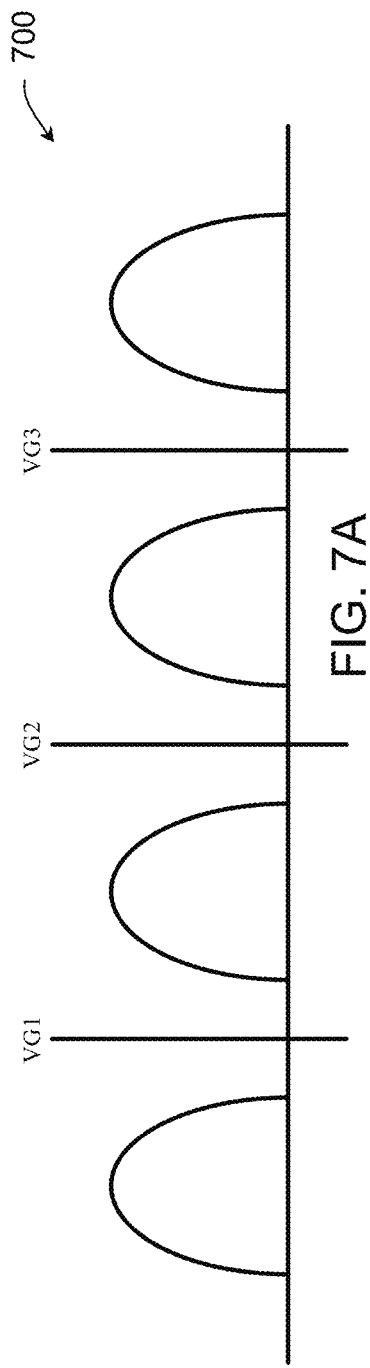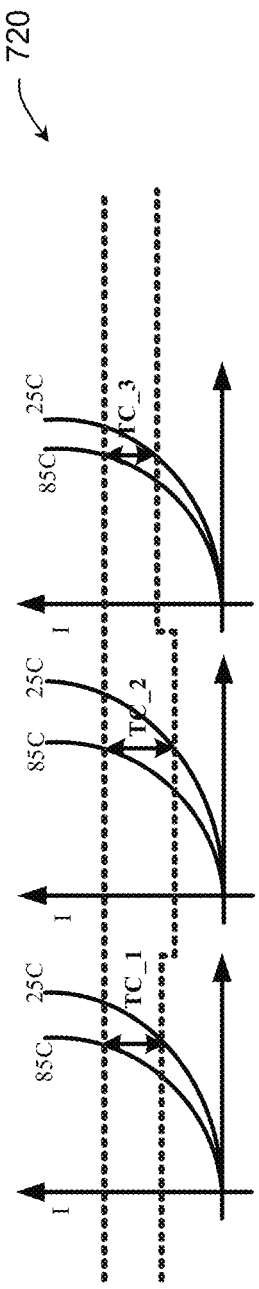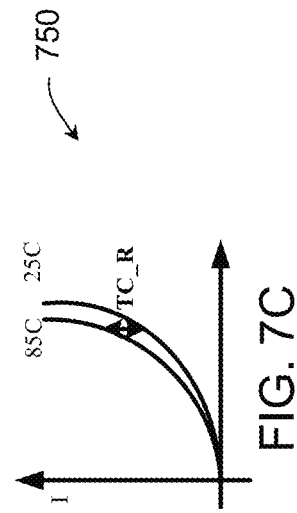

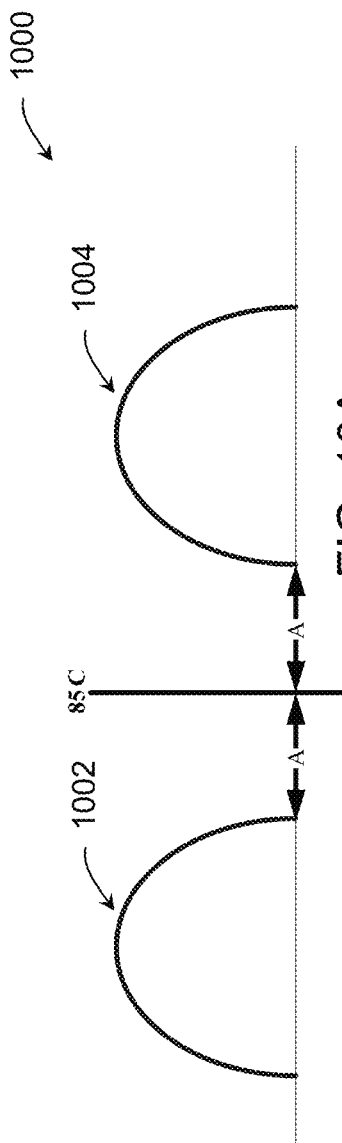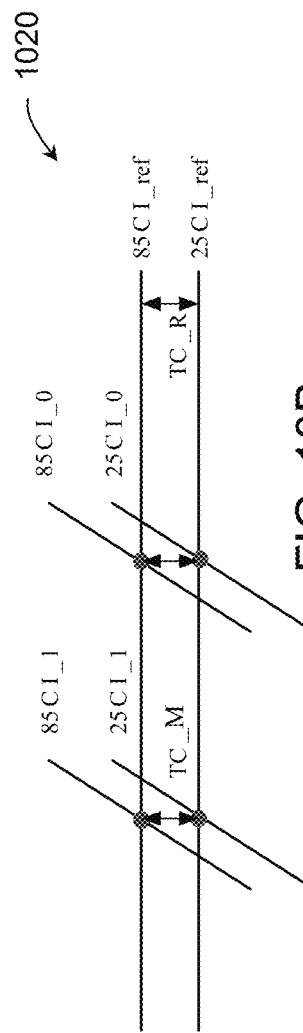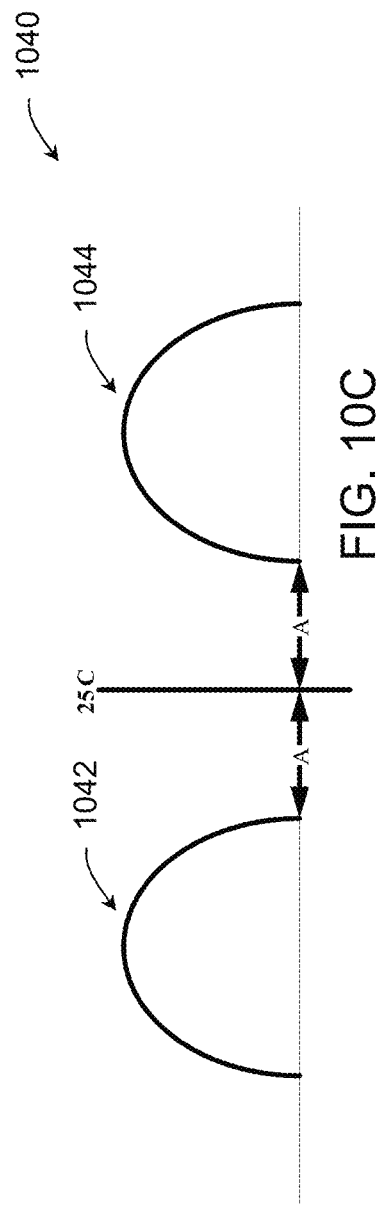

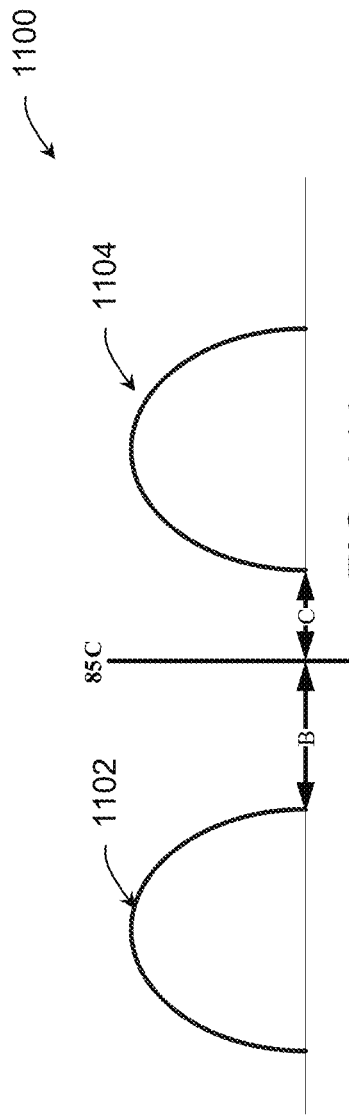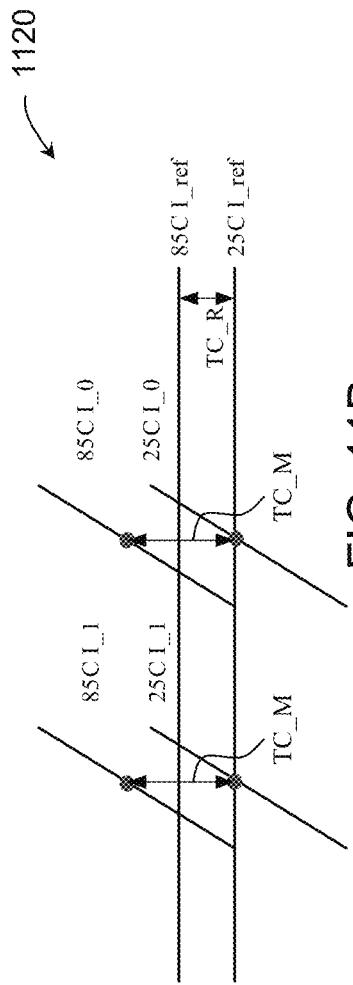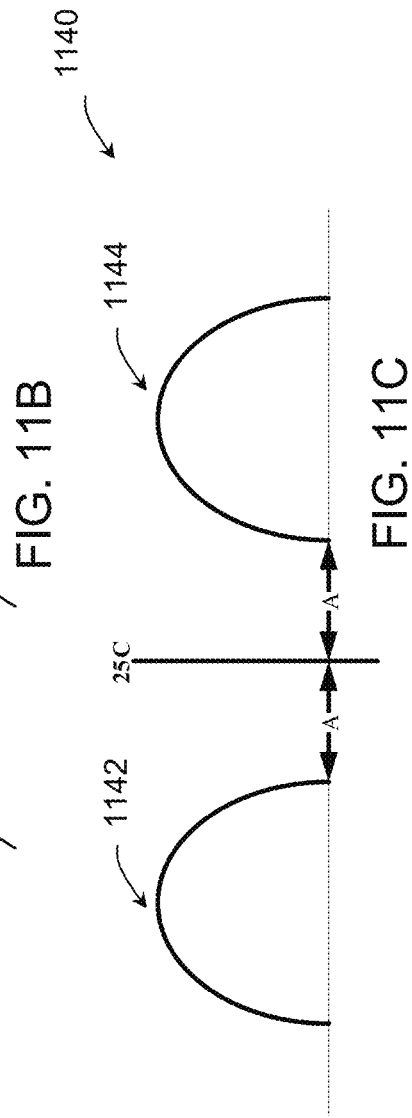

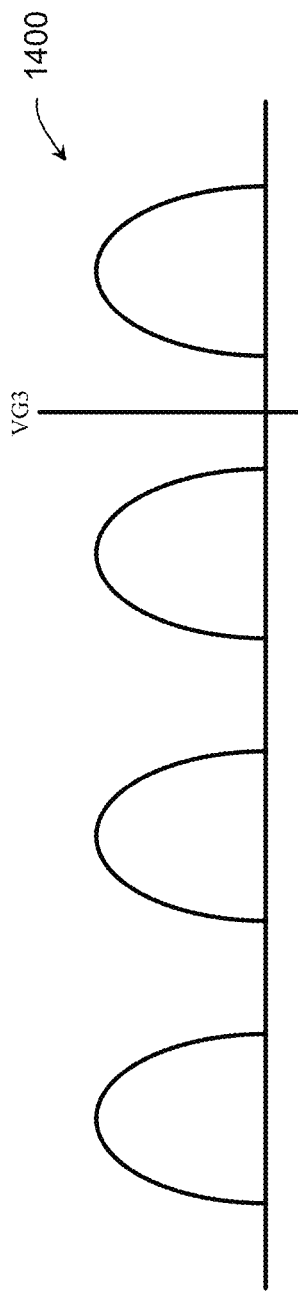
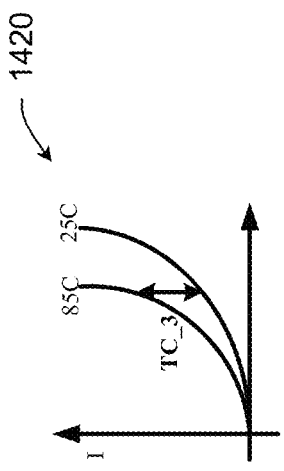
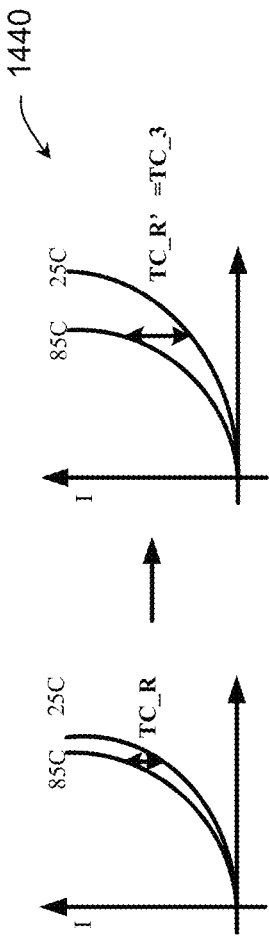
FIG. 14A
FIG. 14B
FIG. 14C

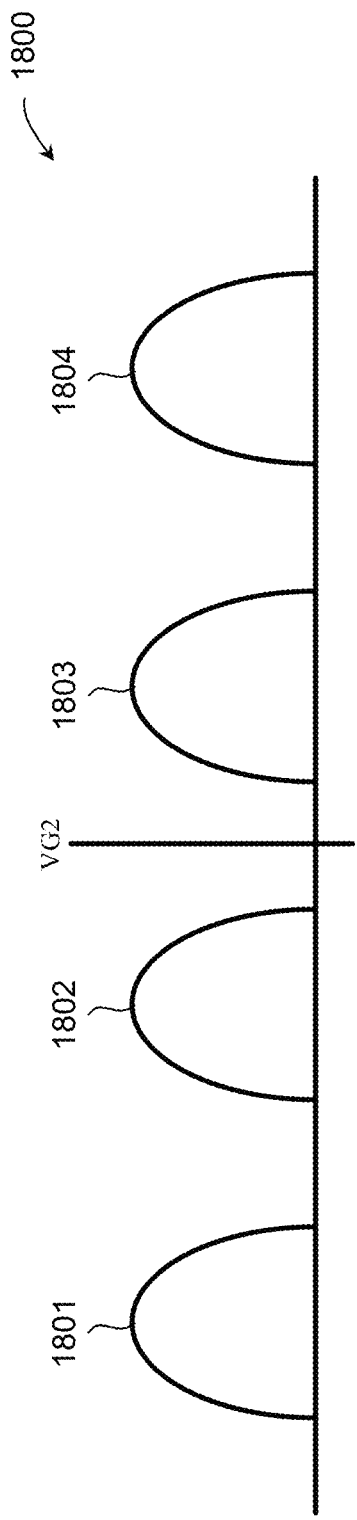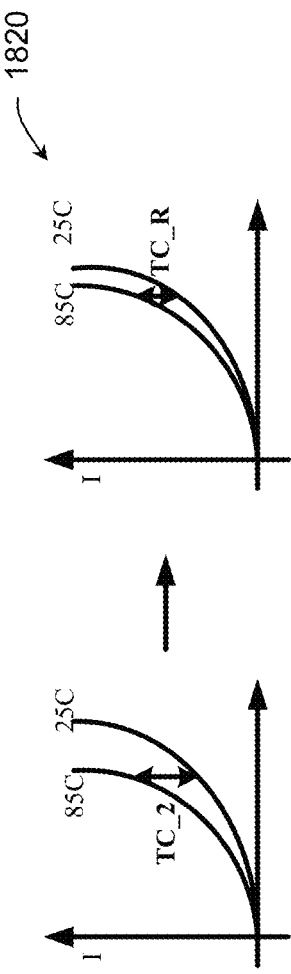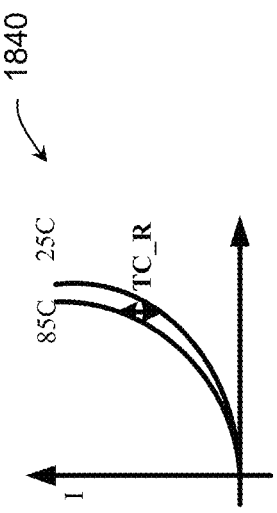

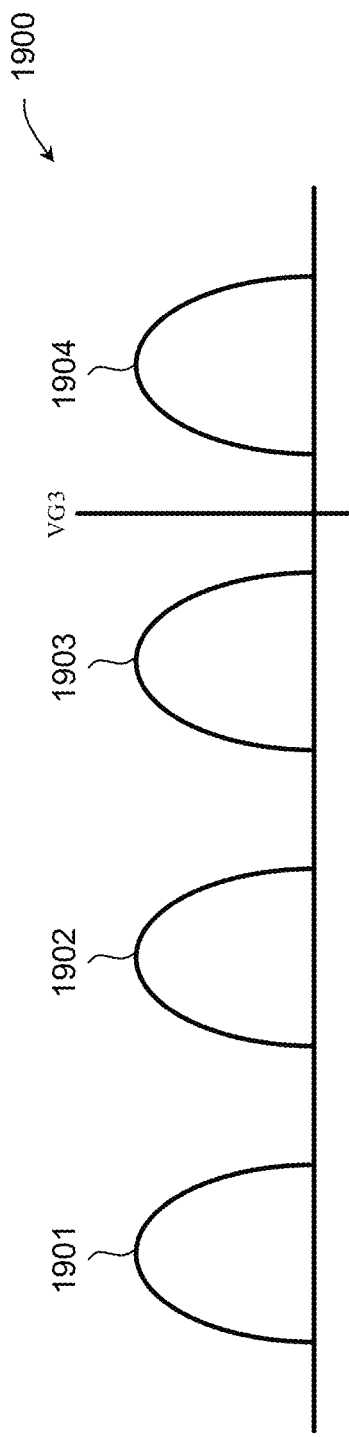
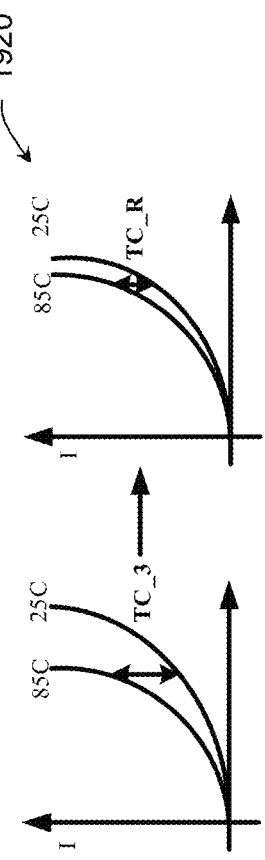
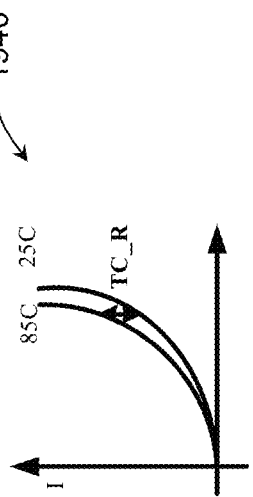
FIG. 19A
FIG. 19B
FIG. 19C

MEMORY WITH TEMPERATURE COMPENSATION

BACKGROUND

1. Technical Field

The present application relates generally to semiconductor devices and includes memory devices with temperature compensation.

2. Related Art

FIG. 1 is a schematic diagram of a flash memory cell 100. In simple terms, a flash memory cell includes an N-channel transistor 102 with an electrically isolated polysilicon floating gate 104 and a control gate 106. The flash memory cell 100 can be thought of as a capacitor which is charged and discharged.

The flash memory cell 100 is programmed by applying a high drain-to-source bias voltage with a high control gate voltage. Programming a flash memory cell 100 means that electrons are added to the floating gate 104. Adding electrons, or charge, to the floating gate 104 increases the flash memory cell's threshold voltage $V_T$.

The flash memory cell 100 is erased (the charges are removed from the floating gate 104) by applying electrical voltages between the floating gate and the source or between the floating gate and the channel. After electrons are removed from the floating gate 104, the cell threshold voltage $V_T$ is reduced.

During a read operation, flash memory devices use precise charge sensing algorithms to determine whether a desired cell voltage has been achieved. A sense amplifier compares a cell's drain current with the drain current of a reference cell to determine whether the cell is programmed or erased. With multilevel cells (MLCs), comparisons between a cell and a reference cell are made to determine the different charge levels, or states, of the MLC. A method of controlling exactly how much charge is transferred to the floating gate of the MLC is used to ensure that enough charge to achieve a certain MLC state without overshooting that state. Further, a precise way to sense the cell voltage is used to determine the different MLC states.

With MLC flash memory, the data write may occur at one temperature, and the data read may occur at a different temperature. A flash cell's drain current is a function of the temperature conditions, and the precision of both writing and reading the MLC states may be affected. To minimize the affect on read/write precision, one solution may be to include reference cells on-chip, allowing cells and the reference cells to be affected similarly by temperature and power supply. However, for efficiency and space reasons, it may not be desirable to have reference cells on-chip.

Thus, it is desirable to find new approaches for improving precision of sensing or reading MLC states, particularly so as to minimize the affect of temperature variations on reading and sensing MLC states.

SUMMARY

Disclosed herein are methods and systems for matching temperature coefficients of reference cells with temperature coefficients of memory cells. Also disclosed herein are memory elements in which the temperature coefficients of the reference cells substantially match the temperature coefficients of the memory cells. Such matching results in more precise reading or sensing of memory element states, particularly so as to minimize the affect of temperature variations on reading and sensing states.

According to an aspect, a temperature coefficient of a reference cell current is tuned to substantially match the temperature coefficient of the memory cell current. According to another aspect, a memory cell temperature coefficient is tuned to substantially match a reference cell temperature coefficient.

According to an aspect, a desired charge sensing level and whether the desired charge sensing level has been reached is determined. According to another aspect, a reference voltage is used to determine the temperature coefficients. Tuning a temperature coefficient may be done by setting a reference word line voltage. The temperature coefficient information may be stored in trimming bits in the memory element.

According to an aspect, the memory element may be a multi level memory element having multiple sensing levels.

According to another aspect, the memory element may be a single level memory element having a single sensing level.

BRIEF DESCRIPTION OF THE DRAWINGS

Features, aspects, and embodiments of the disclosure are described in conjunction with the attached drawings, in which:

FIGS. 2A and 2B are graphical diagrams illustrating temperature coefficients of different sensing states in an MLC, in accordance with the present disclosure;

FIGS. 5A-5C are graphical diagrams illustrating another MLC cell and reference cell temperature coefficients, in accordance with the present disclosure;

FIGS. 7A-7C are graphical diagrams illustrating another MLC cell and reference cell temperature coefficients, in accordance with the present disclosure;

FIGS. 10A-C are graphical diagrams illustrating minimal or no window loss in an MLC memory element, in accordance with the present disclosure;

FIGS. 11A-C are graphical diagrams illustrating window loss in an MLC memory element, in accordance with the present disclosure;

FIGS. 14A-C are graphical diagrams illustrating a method for third state sensing with temperature coefficient tuning, in accordance with the present disclosure;

FIGS. 18A-C are graphical diagrams illustrating another method for second state sensing with temperature coefficient tuning, in accordance with the present disclosure;

FIGS. 19A-C are graphical diagrams illustrating another method for third state sensing with temperature coefficient tuning, in accordance with the present disclosure;

DETAILED DESCRIPTION

Figure 1:
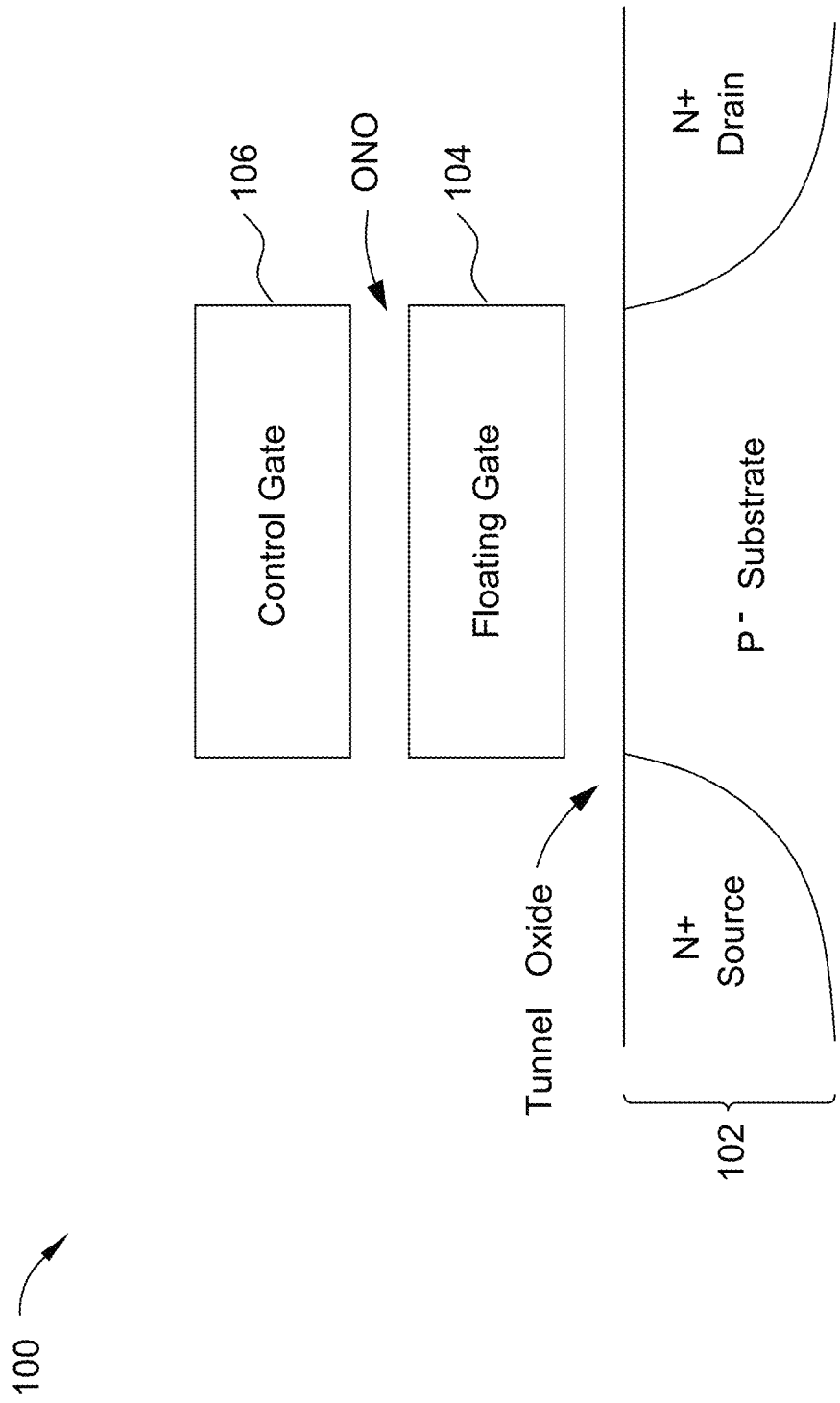
FIG. 1 is a schematic diagram of a memory cell.

Reference cell current variations with temperature are different from memory cell current variations with temperature, meaning that the temperature coefficient of a reference cell ($Tc_R$) is different from the temperature coefficient of a memory cell $Tc_M$. The temperature coefficients ($Tc_M$) of different MLC states or levels (e.g., $Tc_M$ of VG1) in a memory cell are also different. For example, in a standard multiple level cell flash memory, $Tc_M$ of VG1≠$Tc_M$ of VG2≠$Tc_M$ of VG3≠$Tc_M$ of VG4. Further, for different processes or desired number of MLC states may have different temperature coefficients Tc associated with the memory elements.

Disclosed herein is a system and method for supporting a Tc tunable reference word line for tuning the $Tc_R$ of a reference cell and matching the $Tc_M$ of a memory cell in each MLC state or level of an MLC flash memory element. In an embodiment, different reference cells are used for each MLC state or level, and each reference cell has the average program charge within its sensing boundary. Also disclosed herein is a system and method for supporting a Tc tunable memory array word line to tune the $Tc_M$ of a memory cell and match the $Tc_R$ of the reference cell in each MLC state or level of a multi level flash memory element. Tuning a reference word line may be more efficient than tuning a memory array word line due to faster setup time.

FIGS. 2A and 2B are graphical diagrams 200, 250 illustrating temperature coefficients of different sensing states in an MLC. Graphical diagram 200 illustrates array cell current characteristics at different sensing states. Graphical diagram 250 illustrates reference cell current characteristics at different sensing states. At a first sensing state 210 for the array cell current, the array cell current variation 201 at different temperatures—low temperature LT, room temperature RT, and high temperature HT—is relatively small at a current level 230. But at a second sensing state 220 for the array cell current, the array cell current variation 203 at different temperatures is relatively large at the current level 230. Meanwhile, at a first sensing state 260 for the reference cell current, the reference cell current variation 251 at different temperatures is relatively small at current level 230. And at a second sensing state 270 for the reference cell current, the reference cell current variation 253 at different temperatures is relatively large at the current level 230.

Figures 3A, 3B:
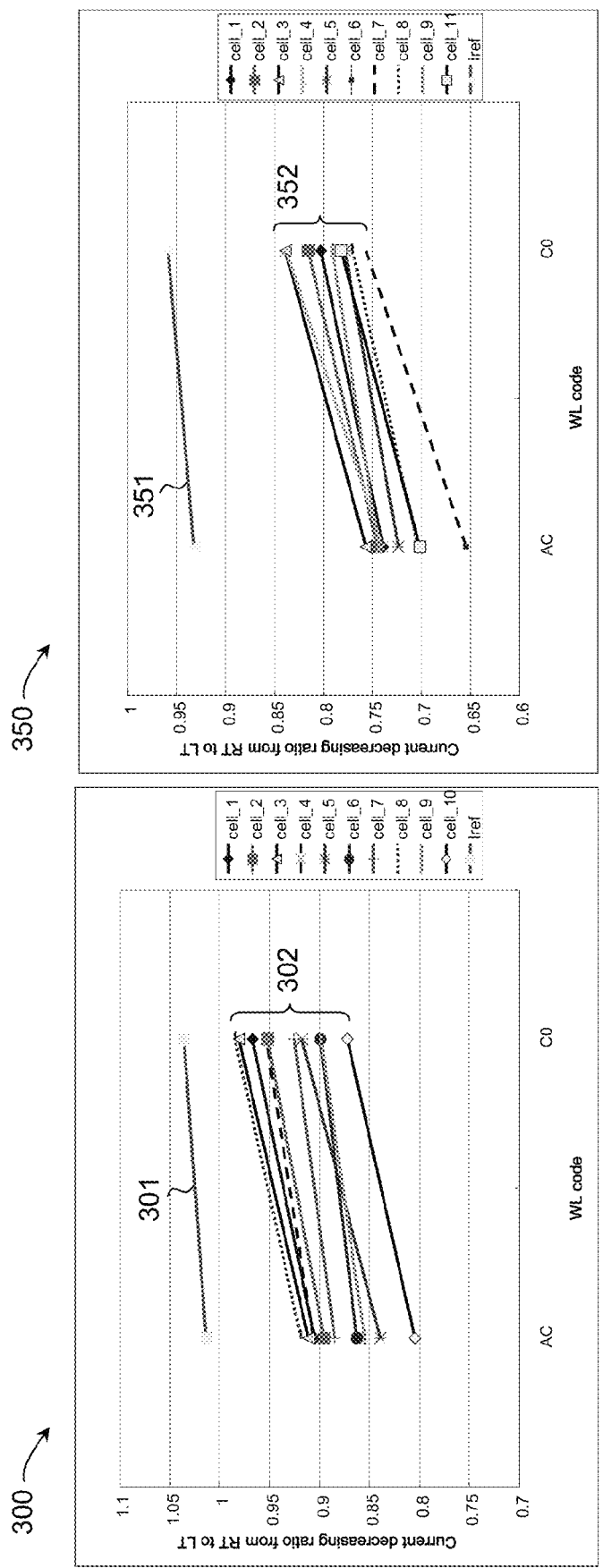
FIGS. 3A and 3B are graphical diagrams illustrating temperature coefficients of sensing and reference currents, in accordance with the present disclosure.

FIGS. 3A and 3B are graphical diagrams 300, 350 illustrating temperature coefficients of sensing and reference currents. As can be seen in graph 300, the reference cell temperature coefficient 301 is significantly higher than the memory cell temperature coefficients 302. Further, as can be seen in graph 350, the reference cell temperature coefficient 351 is significantly higher than the memory cell temperature coefficients 352.

Figure 4A:
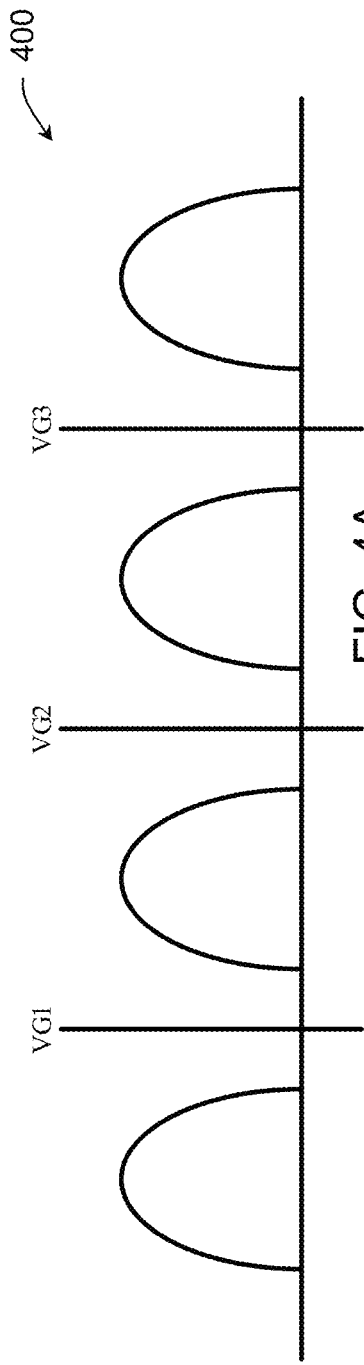
FIGS. 4A-4C are graphical diagrams illustrating MLC cell and reference cell temperature coefficients, in accordance with the present disclosure.
Figure 4B:
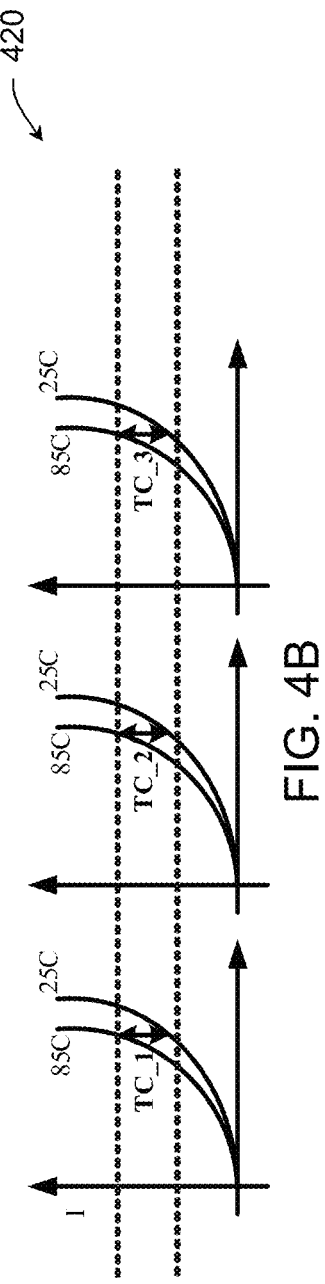
Figure 4C:
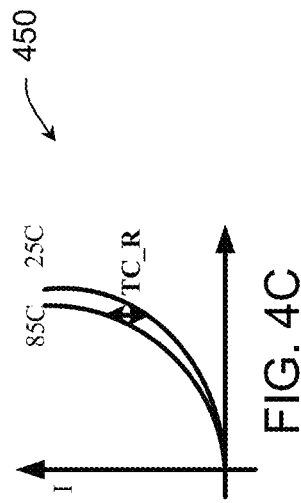

FIGS. 4A-4C are graphical diagrams 400, 420, 450 illustrating MLC cell and reference cell temperature coefficients. Graph 400 shows the window for each state VG1, VG2, and VG3 of an MLC cell. Graph 420 shows the temperature coefficients of the memory cell being approximately the same at each MLC state ($Tc_M$ of VG1≈$Tc_M$ of VG2≈$Tc_M$ of VG3). And graph 450 shows that the temperature coefficient of the reference cell $Tc_R$ is different from the temperature coefficients of the memory cell at each MLC state.

FIGS. 5A-5C are graphical diagrams 500, 520, 550 illustrating another MLC cell and reference cell temperature coefficients. Graph 500 shows the window for each state VG1, VG2, and VG3 of an MLC cell. Graph 520 shows the temperature coefficients of the memory cell being different at each MLC state such that $Tc_M$ of VG1<$Tc_M$ of VG2<$Tc_M$ of VG3. And graph 550 shows that the temperature coefficient of the reference cell $Tc_R$ is different from the temperature coefficients of the memory cell at each MLC state.

Figure 6A:
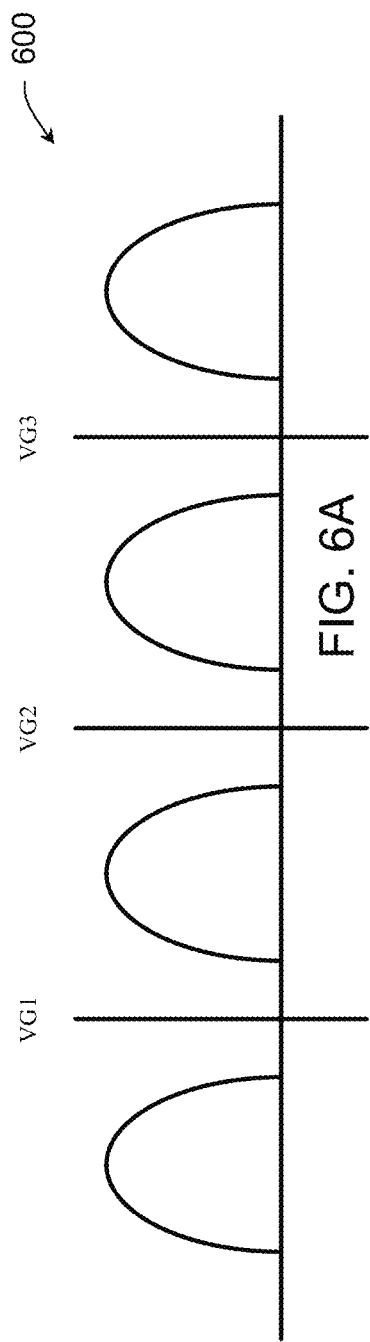
FIGS. 6A-6C are graphical diagrams illustrating another MLC cell and reference cell temperature coefficients, in accordance with the present disclosure.
Figure 6B:
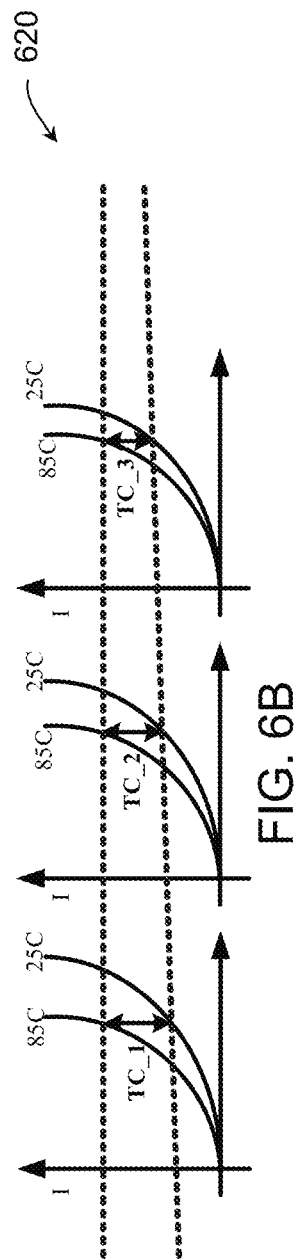
Figure 6C:
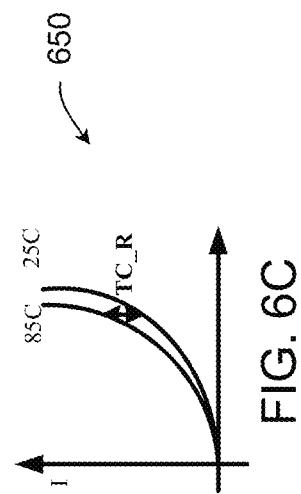

FIGS. 6A-6C are graphical diagrams 600, 620, 650 illustrating another MLC cell and reference cell temperature coefficients. Graph 600 shows the window for each state VG1, VG2, and VG3 of an MLC cell. Graph 620 shows the temperature coefficients of the memory cell being different at each MLC state such that $Tc_M$ of VG1>$Tc_M$ of VG2>$Tc_M$ of VG3. And graph 650 shows that the temperature coefficient of the reference cell $Tc_R$ is different from the temperature coefficients of the memory cell at each MLC state.

FIGS. 7A-7C are graphical diagrams 700, 720, 750 illustrating another MLC cell and reference cell temperature coefficients. Graph 700 shows the window for each state VG1, VG2, and VG3 of an MLC cell. Graphs 720 and 750 show the temperature coefficients of the memory cell being different at each MLC state and different from the temperature coefficient of the reference cell such that $Tc_M$ of VG1, $Tc_M$ of VG2, $Tc_M$ of VG3, and $Tc_R$ are randomly related. For example, $Tc_R$<$Tc_M$ of VG3<$Tc_M$ of VG1<$Tc_M$ of VG2.

Figure 8:
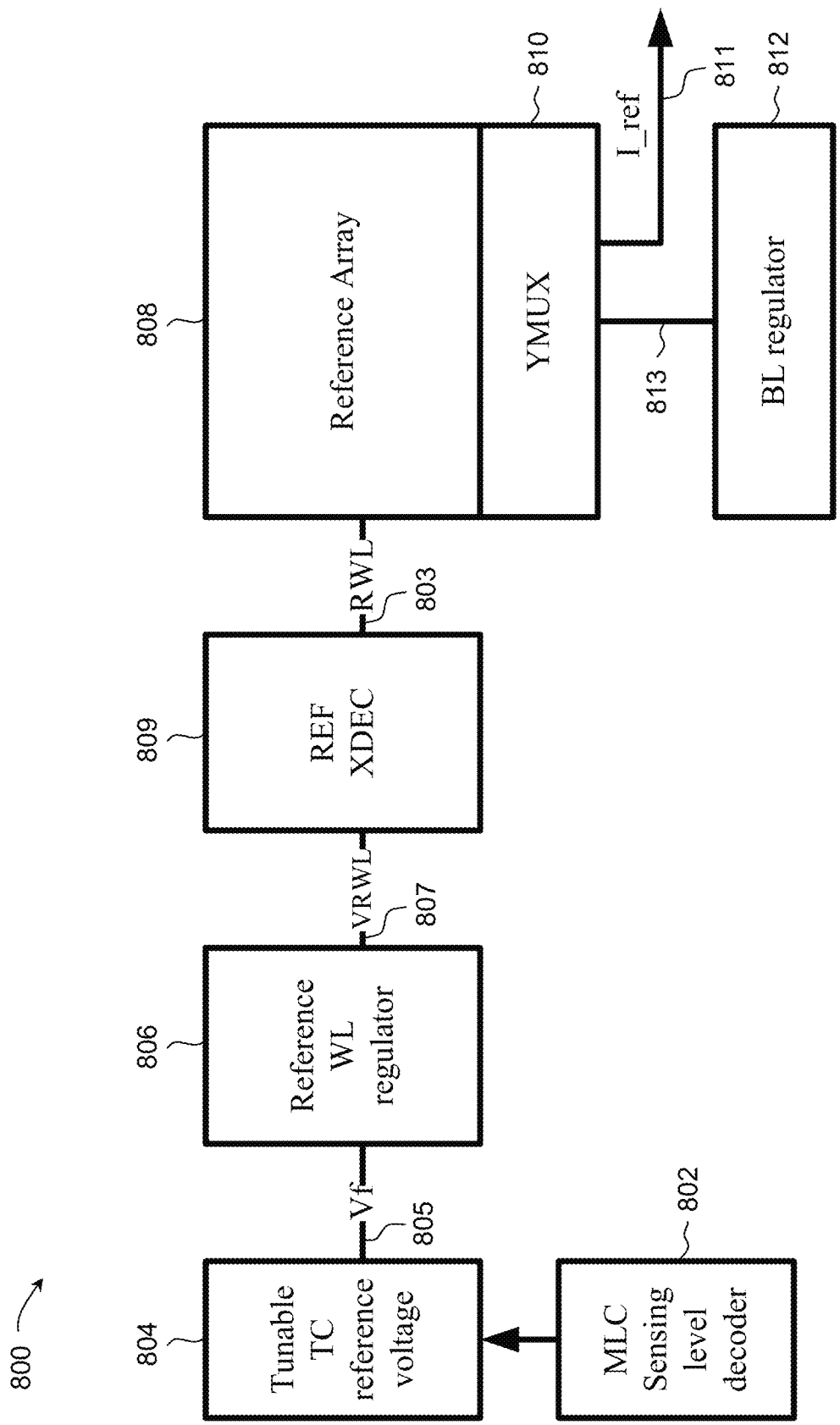
FIG. 8 is a block diagram illustrating a system for tuning the temperature coefficient of a reference cell of an MLC memory element, in accordance with the present disclosure.

FIG. 8 is a block diagram illustrating a system 800 for tuning the temperature coefficient of a reference word line of an MLC memory element. System 800 includes an MLC sensing level decoder 802, a temperature coefficient reference voltage tuner 804, a reference word line regulator 806, a reference world line decoder 809 for an array, a reference array 808, a Y multiplexer 810, and a bit line regulator 812. The MLC sensing level decoder 802 can decode the current MLC state. The temperature coefficient reference voltage tuner 804 can provide a reference voltage Vf 805 based on the MLC state provided by the decoder 802. The reference word line regulator 806 can set a reference word line voltage 807 based on the reference voltage Vf 805. The reference word line voltage 807 is provided to the word line decoder (XDEC) 809 for the array. The word line decoder (XDEC) 809 provides the reference word line 803 to the reference array 808. The bit line regulator 812 can set a bit word line 813. The Y multiplexer 810 is used to generate a reference current I_ref 811 based on the reference word line 807 and bit word line 813.

The regulator 806 can compensate the voltage change based on temperature variations. In one embodiment, the voltage is proportional to absolute temperature (PTAT). In another embodiment, the voltage is conversely to absolute temperature (CTAT). Thus, the regulator 806 may output a PTAT, CTAT, or temperature independent voltage. The temperature coefficient for each MLC state may be the same or different, depending on the application, and the temperature coefficient of the reference word line can be tuned to match the temperature coefficient for each MLC state. The temperature coefficient information may be stored in the trimming bits—i.e., trimming information stored in some of the memory cells. At each MLC state or level, the trimming bits may define the reference voltage Vf that the MLC memory element should use.

Figure 9:
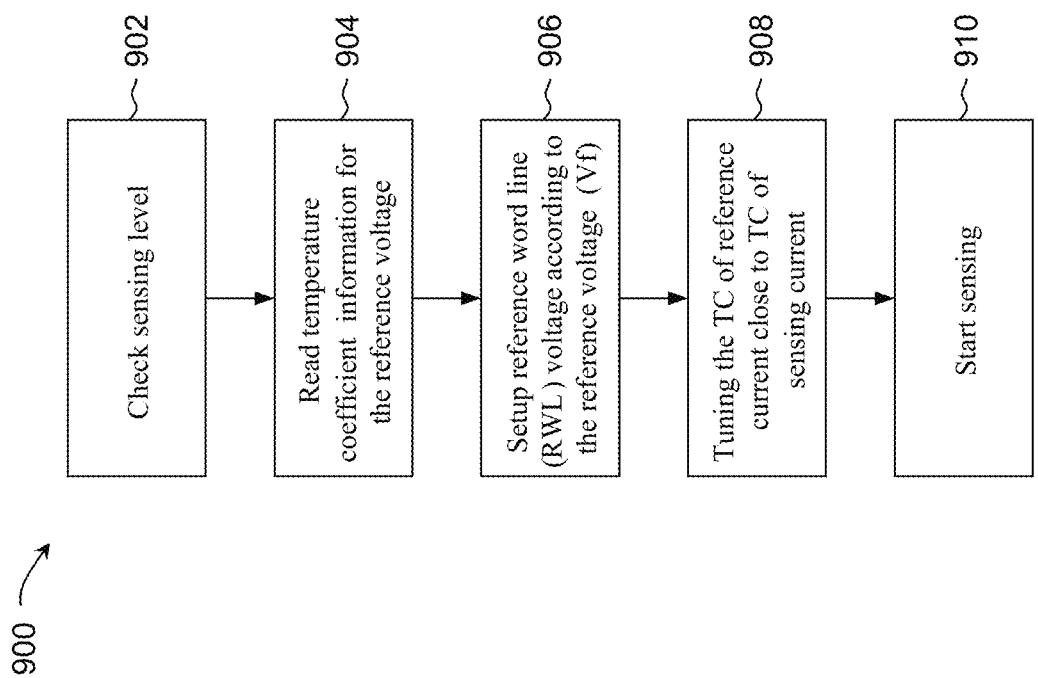
FIG. 9 is a flow diagram illustrating a process for tuning the temperature coefficient of a reference cell of an MLC memory element, in accordance with the present disclosure.

FIG. 9 is a flow diagram 900 illustrating a process for tuning the temperature coefficient of a reference cell of an MLC memory element. The sensing level is checked at action 902. The temperature coefficient information for the reference voltage Vf is read at action 904. The reference word line (RWL) voltage is set according to the reference voltage at action 906. The temperature coefficient of the reference current is tuned close to the temperature coefficient of the memory cell current at action 908. Once the temperature coefficients are tuned, sensing is started at action 910.

In an embodiment, a method for tuning the temperature coefficient of a reference cell of a multi cell flash memory element includes determining a sensing cell temperature coefficient at action 902, determining a reference cell temperature coefficient at action 904, and tuning the reference cell temperature coefficient to substantially match the sensing cell temperature coefficient at action 908. The method may further comprise determining a desired sensing level at action 902. Determining the reference cell temperature coefficient at action 904 may include reading temperature coefficient information for a reference voltage. The method may further include setting a reference word line voltage based on the reference voltage at action 906. As discussed above in relation to FIG. 8, the temperature coefficient for each MLC state may be the same or different, depending on the application, and the temperature coefficient of the reference word line can be tuned to match the temperature coefficient for each MLC state. The temperature coefficient information may be stored in the trimming bits. At each MLC state or level, the trimming bits may define the reference voltage Vf that the MLC memory element should use.

FIGS. 10A-C are graphical diagrams 1000, 1020, 1040 illustrating minimal or no window loss in an MLC memory element. Graph 1020 shows that the temperature coefficient of the reference word line voltage is tuned such that the temperature coefficient of the reference current $Tc_R$ is substantially the same as the temperature coefficient of the memory cell current $Tc_M$. Accordingly, graph 1000 shows an MLC sensing window at 85° C. for data "1" state 1002 and data "0" state 1004. In an embodiment, the sensing window has a length 2A. Graph 1040 shows an MLC sensing window at 25° C. for a data "1" state 1042 and a data "0" state 1044, which also has a length 2A. Thus, substantially no window loss results when the temperature coefficient of the reference current $Tc_R$ is substantially the same as the temperature coefficient of the memory cell current $Tc_M$.

FIGS. 11A-C are graphical diagrams 1100, 1120, 1140 illustrating window loss in an MLC memory element. Graph 1120 shows that the temperature coefficient of the reference word line voltage is not sufficiently tuned, and the temperature coefficient of the reference current $Tc_R$ is different the temperature coefficient of the memory cell current $Tc_M$. Accordingly, graph 1100 shows an MLC sensing window at 85° C. with a data "1" state 1102 sensing window portion of length B and a data "0" state 1104 sensing window portion of length C. The data "1" state 1102 sensing window portion (length B) is a different length than that of the data "1" state sensing window portion of FIG. 10A (see FIG. 10A, length A, 1002) because of the different temperature coefficient of the memory cell in relation to the reference cell. The data "0" state 1104 sensing window portion (length C) is a different size than that of the data "0" state sensing window portion of FIG. 10A (see FIG. 10A, length A, 1004) because of the different temperature coefficient of the memory cell in relation to the reference cell. Graph 1140 shows a sensing window at 25° C. with a data "1" state 1142 sensing window portion of length A and a data "0" state 1144 sensing window portion also of length A. Thus, window loss results when the temperature coefficient of the reference current $Tc_R$ is different than the temperature coefficient of the memory cell current $Tc_M$.

Figure 12A:
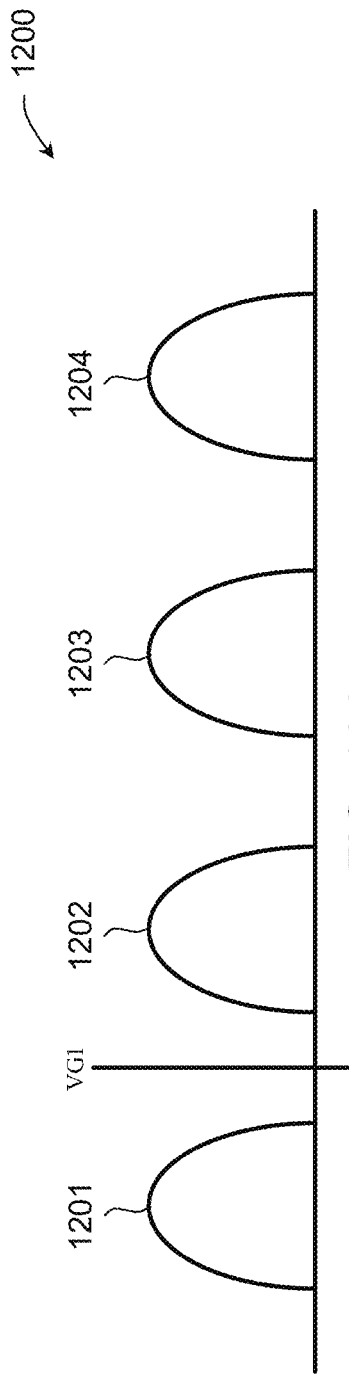
FIGS. 12A-C are graphical diagrams illustrating a method for first state sensing with temperature coefficient tuning, in accordance with the present disclosure.
Figure 12B:
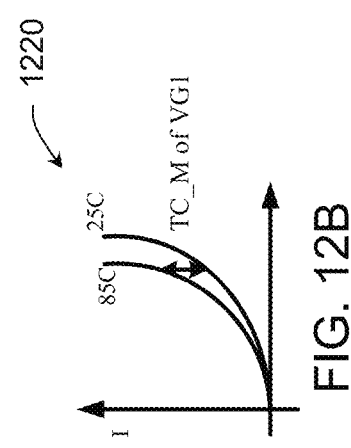
Figure 12C:
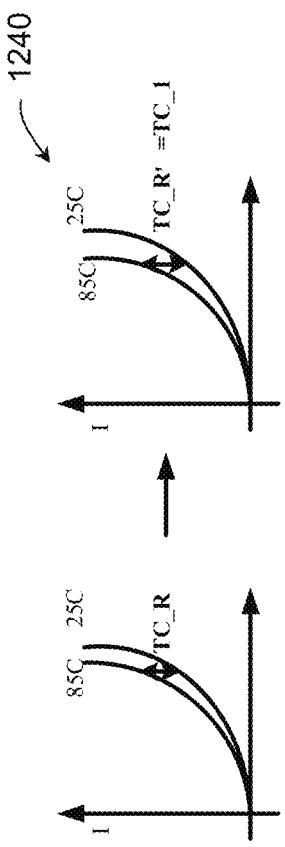

FIGS. 12A-C are graphical diagrams 1200, 1220, 1240 illustrating a method for first state sensing with temperature coefficient tuning Graph 1200 shows different MLC states 1201, 1202, 1203, 1204. When sensing the MLC state 1201, the voltage sensed is below VG1. Graph 1220 illustrates the temperature coefficient of the MLC state 1201 ($Tc_M$ of VG1). Graph 1240 shows that the temperature coefficient of the reference cell $Tc_R$ is tuned to be substantially the same as $Tc_M$ of VG1.

Figure 13A:
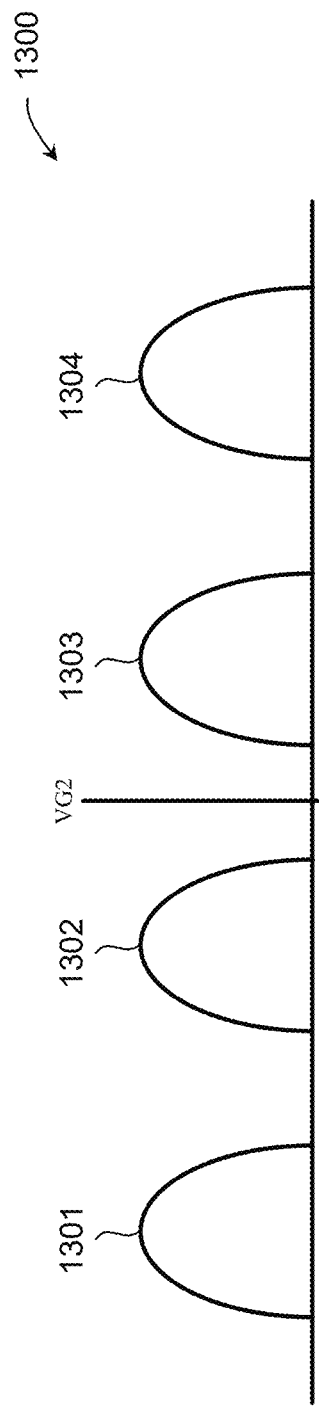
FIGS. 13A-C are graphical diagrams illustrating a method for second state sensing with temperature coefficient tuning, in accordance with the present disclosure.
Figure 13B:
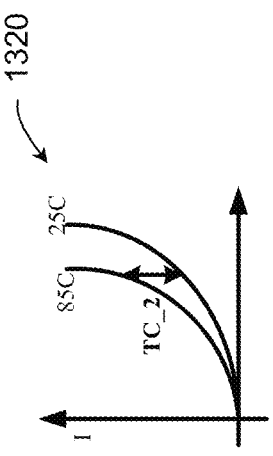
Figure 13C:
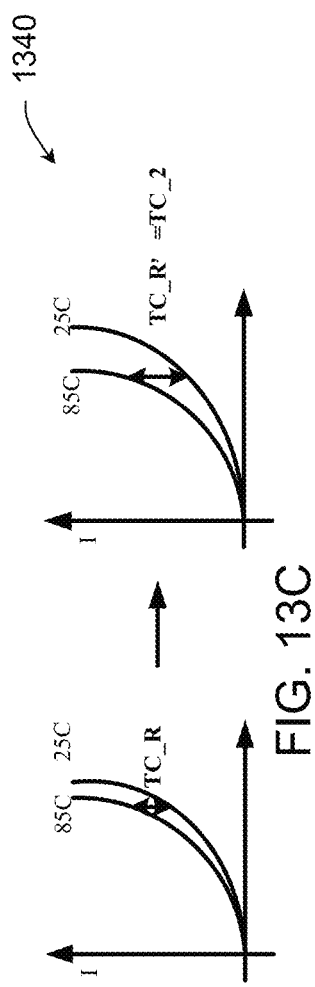

FIGS. 13A-C are graphical diagrams 1300, 1320, 1340 illustrating a method for second state sensing with temperature coefficient tuning Graph 1300 shows different MLC states 1301, 1302, 1303, 1304. When sensing the MLC state 1302, the voltage sensed is below VG2. Graph 1320 illustrates the temperature coefficient of the MLC state 1302 ($Tc_M$ of VG2). Graph 1340 shows that the temperature coefficient of the reference cell $Tc_R$ is tuned to be substantially the same as $Tc_M$ of VG2.

FIGS. 14A-C are graphical diagrams 1400, 1420, 1430 illustrating a method for third state sensing with temperature coefficient tuning Graph 1400 shows different MLC states 1401, 1402, 1403, 1404. When sensing the MLC state 1303, the voltage sensed is below VG3. Graph 1420 illustrates the temperature coefficient of the MLC state 1403 ($Tc_M$ of VG3). Graph 1440 shows that the temperature coefficient of the reference cell $Tc_R$ is tuned to be substantially the same as $Tc_M$ of VG3.

Figure 15:
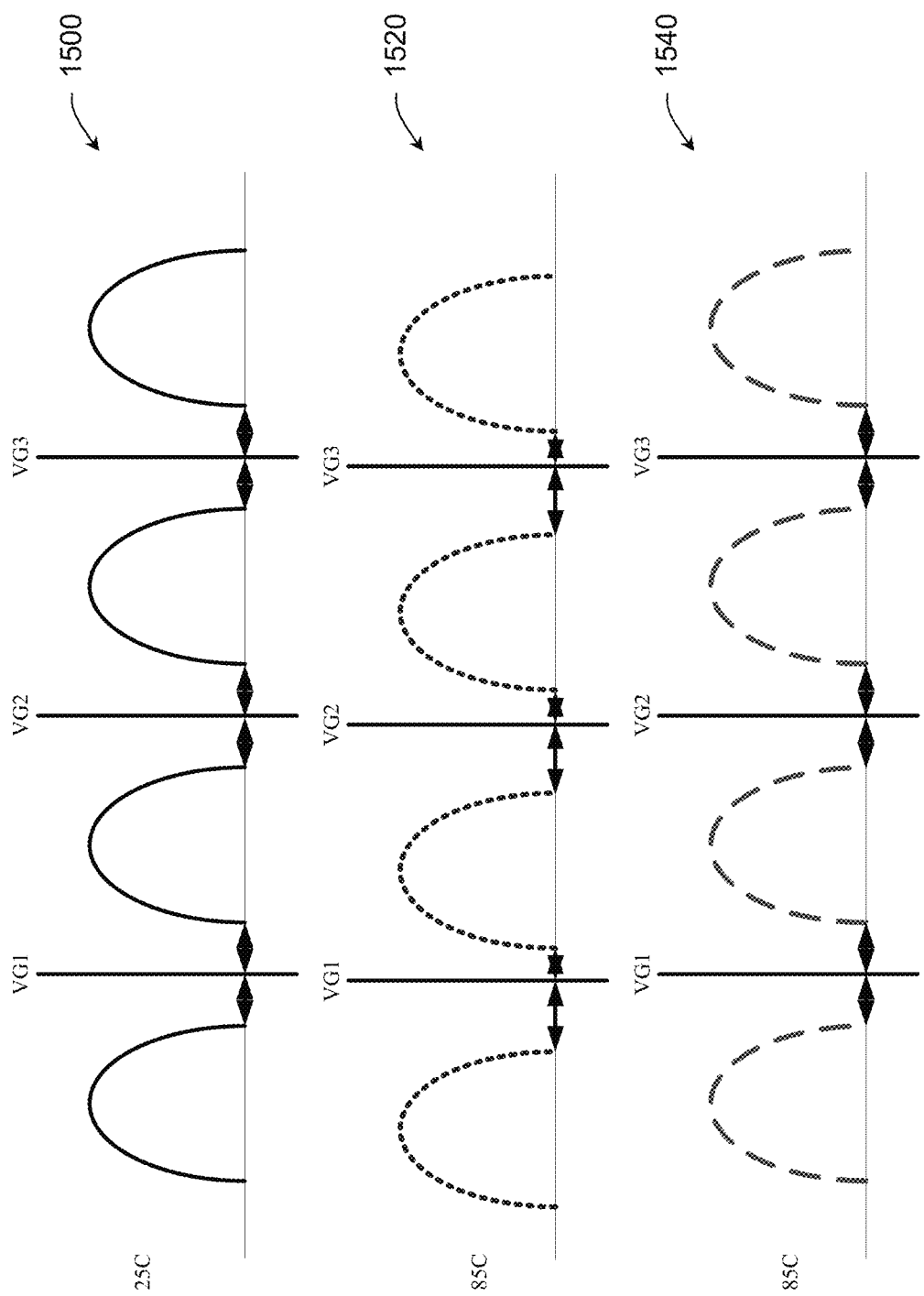
FIG. 15 is a graphical diagram illustrating an MLC window with and without temperature compensation, in accordance with the present disclosure.

FIG. 15 is a graphical diagram illustrating an MLC window with and without temperature compensation. Graph 1500 shows an MLC window at 25° C. Graphs 1520 and 1540 show an MLC window at 85° C. Graph 1520 shows an MLC window without temperature compensation. Note that the windows at each MLC state have changed from the 25° C. windows, which may result in imprecise reads. Graph 1540 shows an MLC window with temperature compensation. Note that the windows at each MLC state are substantially the same as the 25° C. windows, allowing for greater precision when reading MLC states.

Figure 16:
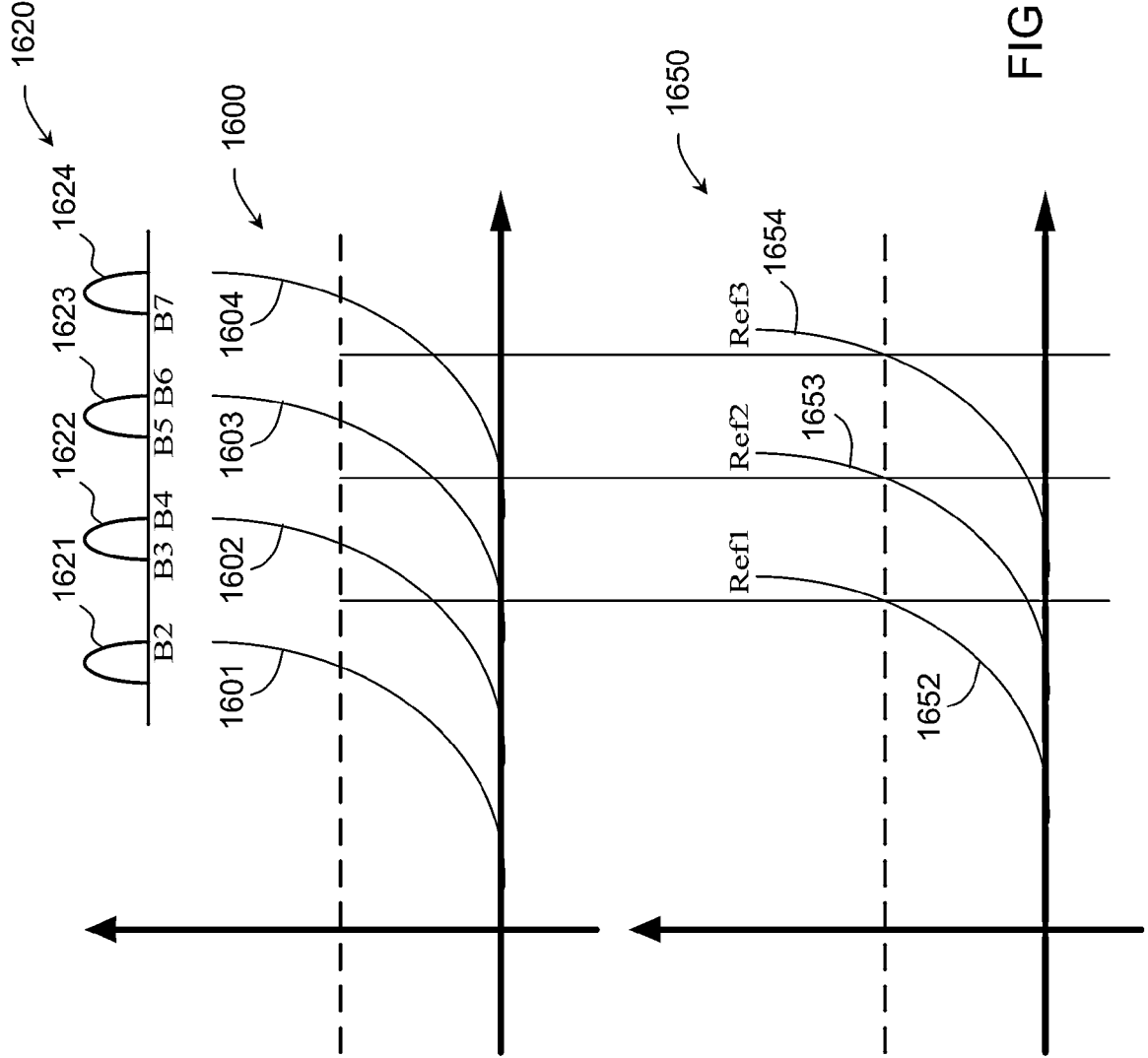
FIG. 16 is a graphical diagram illustrating a method for temperature coefficient tuning, in accordance with the present disclosure.

FIG. 16 is a graphical diagram illustrating a method for temperature coefficient tuning. In an embodiment, three reference cells correspond to sensing levels of an MLC. Each reference cell has substantially similar temperature coefficient as its corresponding memory level cells.

The MLC $V_T$ distribution is shown at 1620, which includes level 1 $V_T$ distribution 1621, level 2 $V_T$ distribution 1622, level 3 $V_T$ distribution 1623, and level 4 $V_T$ distribution 1624. Graph 1600 shows the I-V curves of the cells corresponding to the various levels of graph 1620. For example, the I-V curve of a cell corresponding to the level 1 $V_T$ distribution 1621 is shown at 1601, the I-V curve of a cell corresponding to the level 2 $V_T$ distribution 1622 is shown at 1602, the I-V curve of a cell corresponding to the level 3 $V_T$ distribution 1623 is shown at 1603, the I-V curve of a cell corresponding to the level 4 $V_T$ distribution 1624 is shown at 1604. Graph 1650 shows the I-V curves of the reference cells. For example, the I-V curve of the first reference cell is shown at 1652, the I-V curve of the second reference cell is shown at 1653, the I-V curve of the third reference cell is shown at 1654.

Figure 17A:
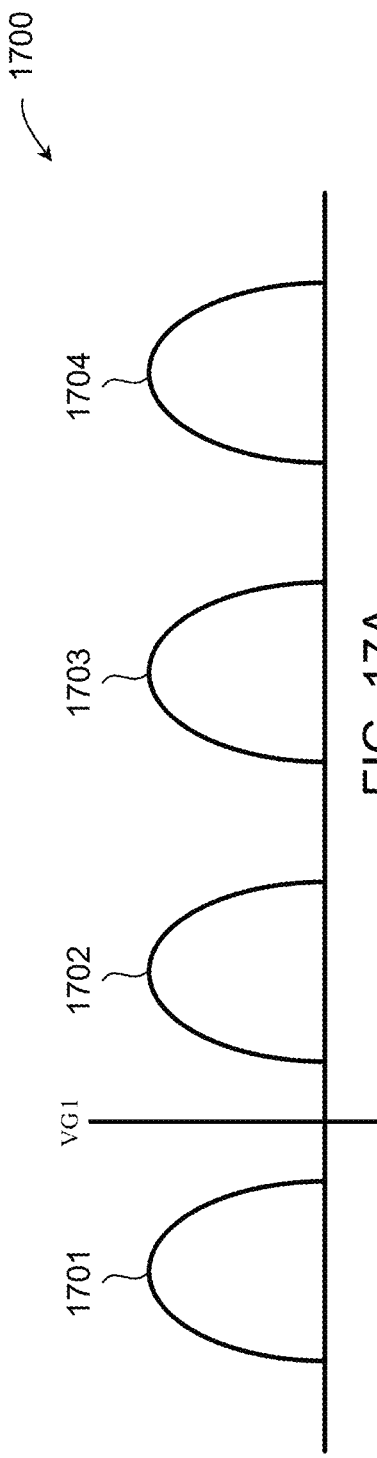
FIGS. 17A-C are graphical diagrams illustrating another method for first state sensing with temperature coefficient tuning, in accordance with the present disclosure.
Figure 17B:
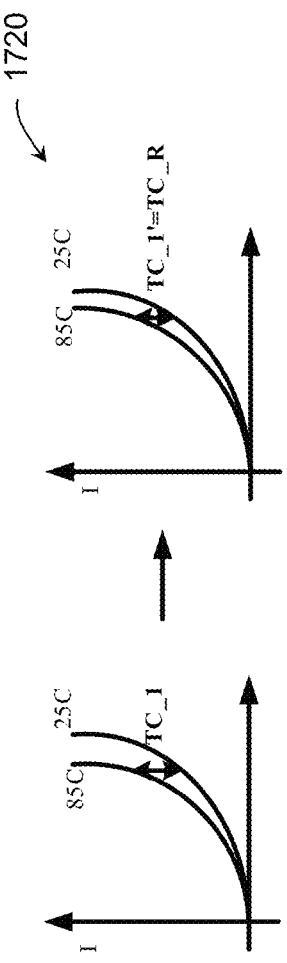
Figure 17C:
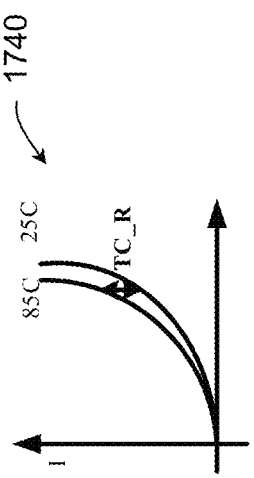

FIGS. 17A-C are graphical diagrams 1700, 1720, 1740 illustrating another method for first state sensing with temperature coefficient tuning Graph 1700 shows different MLC states 1701, 1702, 1703, 1704. When sensing the MLC state 1701, the voltage sensed is below VG1. Graph 1740 illustrates the temperature coefficient of the reference cell ($Tc_R$). Graph 1720 shows that the temperature coefficient of the 1701 MLC state ($Tc_M$ of VG1) is tuned to be substantially the same as the reference cell $Tc_R$.

FIGS. 18A-C are graphical diagrams 1800, 1820, 1840 illustrating another method for second state sensing with temperature coefficient tuning Graph 1800 shows different MLC states 1801, 1802, 1803, 1804. When sensing the MLC state 1802, the voltage sensed is below VG2. Graph 1840 illustrates the temperature coefficient of the reference cell ($Tc_R$). Graph 1820 shows that the temperature coefficient of the 1801 MLC state ($Tc_M$ of VG2) is tuned to be substantially the same as the reference cell $Tc_R$.

FIGS. 19A-C are graphical diagrams 1900, 1920, 1940 illustrating another method for third state sensing with temperature coefficient tuning Graph 1900 shows different MLC states 1901, 1902, 1903, 1904. When sensing the MLC state 1903, the voltage sensed is below VG3. Graph 1940 illustrates the temperature coefficient of the reference cell ($Tc_R$). Graph 1920 shows that the temperature coefficient of the 1901 MLC state ($Tc_M$ of VG3) is tuned to be substantially the same as the reference cell $Tc_R$.

Figure 20:
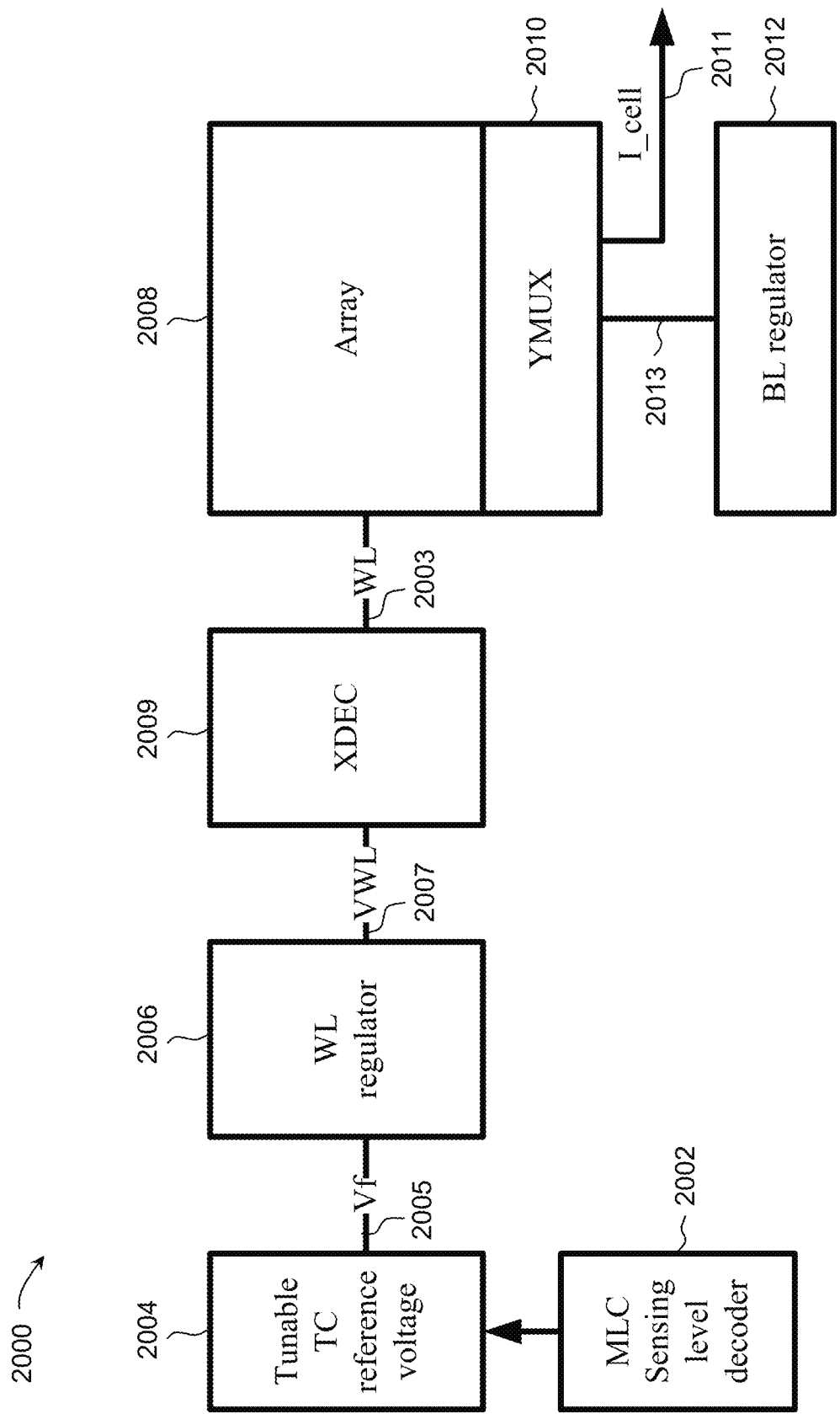
FIG. 20 is a block diagram illustrating a system for tuning the temperature coefficient of a cell of an MLC memory element, in accordance with the present disclosure.

FIG. 20 is a block diagram illustrating a system 2000 for tuning the temperature coefficient of a cell of an MLC memory element. System 2000 includes an MLC sensing level decoder 2002, a temperature coefficient voltage tuner 2004, a word line regulator 2006, a reference word line decoder (REFXDEC) 2009 for an array, the array 2008, a Y multiplexer 2010, and a bit line regulator 2012. The MLC sensing level decoder 2002 can decode the current MLC state. The temperature coefficient reference voltage tuner 2004 can provide a reference voltage Vf 2005 based on the MLC state provided by the decoder 2002. The word line regulator 2006 can set a word line voltage 2007 based on the reference voltage Vf 2005. The word line voltage 2007 is provided to the reference word line decoder (REFXDEC) 2009. The reference word line decoder (REFXDEC) 2009 provides a word line 2003 to the array 2008. The word line 2003 is based on the reference word line voltage 2007. The Y multiplexer 2010 is used to generate a cell current I_cell 2011 based on the word line 2007. A voltage regulator 2012 supplies voltage 2013 to array cell 2008. In an embodiment, one reference cell is used for one or more MLC states because the memory cell voltage is tuned instead of the reference cell voltage being tuned. The temperature coefficient information may be stored in the trimming bits. At each MLC state or level, the trimming bits may define the reference voltage Vf that the MLC memory element should use.

Figure 21:
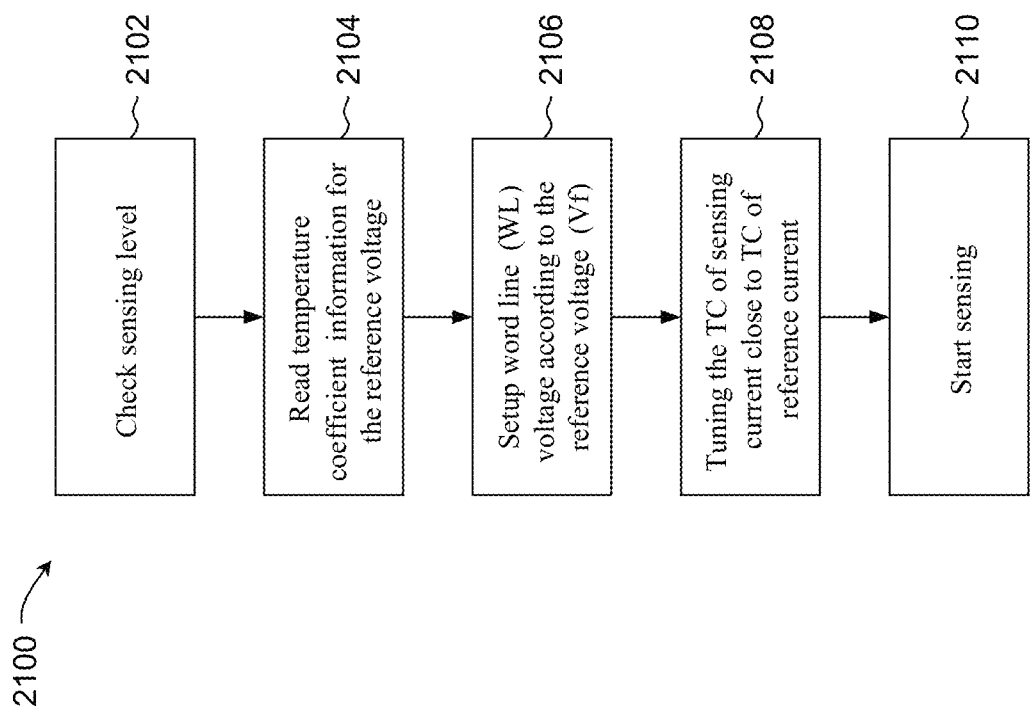
FIG. 21 is a flow diagram illustrating a process for tuning the temperature coefficient of a cell of an MLC memory element, in accordance with the present disclosure.

FIG. 21 is a flow diagram illustrating a process 2100 for tuning the temperature coefficient of a cell of an MLC memory element. The sensing level is checked at action 2102. The temperature coefficient information for the reference voltage Vf is read at action 2104. The word line (WL) voltage is set according to the reference voltage at action 2106. The temperature coefficient of the memory cell current is tuned close to the temperature coefficient of the reference cell current at action 2108. Once the temperature coefficients are tuned, sensing is started at action 2110.

In an embodiment, a method for tuning the temperature coefficient of a memory cell of a multi cell flash memory element includes determining a reference cell temperature coefficient at action 2102, determining a memory cell temperature coefficient at action 2104, and tuning the memory cell temperature coefficient to substantially match the reference cell temperature coefficient at action 2108. The method may further comprise determining a desired reference level at action 2102. Determining the memory cell temperature coefficient at action 2104 may include reading temperature coefficient information for a reference voltage. The method may further include setting a memory word line voltage based on the reference voltage at action 2106. As discussed above in relation to FIG. 20, in an embodiment, one reference cell is used for one or more MLC states because the memory cell voltage is tuned instead of the reference cell voltage being tuned. The temperature coefficient information may be stored in the trimming bits. At each MLC state or level, the trimming bits may define the reference voltage Vf that the MLC memory element should use.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for tuning the temperature coefficient of a reference cell current of a memory element, the method comprising:
   providing a memory cell having a temperature coefficient of a memory cell current;
   providing a reference cell of the memory element having a temperature coefficient of the reference cell current; and
   tuning the temperature coefficient of the reference cell current of the reference cell to substantially match the temperature coefficient of the memory cell current.

2. The method of claim 1, further comprising:
   determining a desired charge sensing level; and determining whether the desired charge sensing level has been reached.

3. The method of claim 1, wherein determining the temperature coefficient of the reference cell current comprises reading temperature coefficient information for a reference voltage.

4. The method of claim 3, further comprising setting a reference word line voltage based on the reference voltage.

5. The method of claim 3, wherein tuning the temperature coefficient of the reference cell current comprises setting a reference word line voltage.

6. The method of claim 3, further comprising storing the temperature coefficient information in trimming bits.

7. The method of claim 6, further comprising defining the reference voltage based on the trimming bits.

8. The method of claim 1, wherein the memory element is a multi level memory element having multiple sensing levels, and further comprising tuning the temperature coefficient of the reference cell current to substantially match the temperature coefficient of the memory cell current at each sensing level of the memory element.

9. The method of claim 8, wherein each sensing level of the memory element comprises a different memory cell temperature coefficient.

10. The method of claim 8, wherein each sensing level of the multi level memory element comprises the same memory cell temperature coefficient.

11. The method of claim 1, wherein the memory element is a single level memory element.

12. The method of claim 1, wherein the memory element is a multi level flash memory element.

13. A method for tuning the temperature coefficient of a memory cell of a memory element, the method comprising:
   providing a memory cell having a memory cell temperature coefficient;
   providing a reference cell of the memory element having a reference cell temperature coefficient; and
   tuning the memory cell temperature coefficient of the reference cell to substantially match the reference cell temperature coefficient.

14. The method of claim 13, further comprising:
   determining a desired charge sensing level; and
   determining whether the desired charge sensing level has been reached.

15. The method of claim 13, wherein determining the temperature coefficient of the reference cell current comprises reading temperature coefficient information for a reference voltage.

16. The method of claim 15, further comprising setting a memory word line voltage based on the reference voltage.

17. The method of claim 15, wherein tuning the temperature coefficient of the memory cell current comprises setting a memory word line voltage.

18. The method of claim 15, further comprising storing the temperature coefficient information in trimming bits.

19. The method of claim 18, further comprising defining the reference voltage based on the trimming bits.

20. The method of claim 13, wherein the memory cell is a multi level memory cell having multiple sensing levels, and further comprising tuning the temperature coefficient of the memory cell current to substantially match the temperature coefficient of the reference cell current at each sensing level of the multi level memory element.

21. The method of claim 20, wherein each sensing level of the multi level memory element comprises a different memory cell temperature coefficient.

22. The method of claim 20, wherein each sensing level of the multi level memory element comprises the same memory cell temperature coefficient.

23. The method of claim 13, wherein the memory element is a single level memory element.

24. The method of claim 13, wherein the memory element is a multi level flash memory element.

25. A memory element, comprising:
   a memory cell having a temperature coefficient of a memory cell current;
   a reference cell having a temperature coefficient of a reference cell current;
   wherein the temperature coefficient of the memory cell current substantially matches the temperature coefficient of the reference cell current of the reference cell.

26. The memory element of claim 25, wherein the temperature coefficient of the memory cell current is tuned to match the temperature coefficient of the reference cell current.

27. The memory element of claim 25, wherein the temperature coefficient of the reference cell current is tuned to match the temperature coefficient of the reference cell current.

* * * * *